(12) United States Patent
Jung (10) Patent No.: US 8,524,604 B2
(45) Date of Patent: Sep. 3, 2013

(54) METHOD FOR FORMING FINE PATTERN OF SEMICONDUCTOR DEVICE

(75) Inventor: Young-Kyun Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 102 days.

(21) Appl. No.: 13/301,351

(22) Filed: Nov. 21, 2011

(65) Prior Publication Data

US 2012/0129316 A1    May 24, 2012

(30) Foreign Application Priority Data

Nov. 19, 2010   (KR) .......................... 10-2010-0115679

(51) Int. Cl.
*H01L 21/311*    (2006.01)

(52) U.S. Cl.
USPC ........... 438/696; 438/691; 438/704; 438/736; 438/738; 257/E21.246; 216/41; 216/46

(58) Field of Classification Search
USPC ................ 438/691, 696, 703, 704, 734, 736, 438/737, 738, 749, 756, 757; 257/E21.246; 216/41, 46
See application file for complete search history.

(56) References Cited

U.S. PATENT DOCUMENTS

| | | | | |
|---|---|---|---|---|
| 7,981,736 | B2 * | 7/2011 | Juengling | 438/157 |
| 2007/0161251 | A1 * | 7/2007 | Tran et al. | 438/725 |
| 2010/0183958 | A1 * | 7/2010 | Inaba | 430/5 |
| 2012/0126338 | A1 * | 5/2012 | Juengling | 257/401 |
| 2012/0126883 | A1 * | 5/2012 | Juengling | 327/581 |

* cited by examiner

*Primary Examiner* — Thanh V Pham
(74) *Attorney, Agent, or Firm* — IP & T Group LLP (57) ABSTRACT

A method for forming fine pattern includes sequentially forming a first thin film and a second thin film over a target layer for patterning, forming a partition over the second thin film, removing the partition after forming spacers on sidewalls of the partition, forming first pattern of the second thin film by etching the second thin film of a first region and the second thin film of a second region while exposing the spacers, forming second pattern of the second thin film by using the spacers as masks and etching the first pattern of the second thin film in the first region, forming first thin film pattern by using the first and second patterns of the second thin film as masks in the first and second regions and etching the first thin film, and etching the pattern target layer.

14 Claims, 13 Drawing Sheets

METHOD FOR FORMING FINE PATTERN OF SEMICONDUCTOR DEVICE

CROSS-REFERENCE TO RELATED APPLICATIONS

The present application claims priority of Korean Patent Application No. 10-2010-0115679, filed on Nov. 19, 2010, which are incorporated herein by reference in its entirety.

BACKGROUND

1. Field

Exemplary embodiments of the present invention relate to a semiconductor device fabrication technology, and more particularly, to a method for forming fine pattern of a semiconductor device by using spacer patterning technology.

2. Description of the Related Art

As the integration degree of semiconductor memory devices increases, the size of semiconductor devices becomes smaller and smaller. Accordingly, the sizes of the circuit patterns of the circuits that constitute a semiconductor device are reduced and are reaching physical limits in terms of exposure processes for forming a mask for transferring a pattern onto a semiconductor substrate or wafer.

However, since upgrading a mask to overcome the limitations in optical definition increases equipment prices and production costs, methods that form fine pattern while addressing the above-discussed features in a conventional mask process are useful.

An example of such a method is Spacer Patterning Technology (SPT) where spacers are formed over a semiconductor substrate and a patterning process is performed on a layer by using the spacers as a mask. Since pattern is formed to have a line width determined depending on the thickness of the spacers according to the spacer patterning technology, the limitation in optical definition is overcome using exposure equipment of argon fluoride (ArF) or krypton fluoride (KrF) and fine pattern, for example, patterns as fine as approximately 30 nm or less may be realized on a substrate.

Here, the spacer patterning technology uses an additional mask process while not requiring an upgraded mask.

In other words, since the spacers are typically formed on the sidewalls of pattern, a line-type partition, which is a sacrificial layer pattern for forming the spacers, is formed and also, since the spacers are formed with a rim shape on the sidewalls of the partition, the spacers are selectively removed and cut for isolation of the pattern, and the pattern is formed to have different line widths in a cell region and a peripheral circuit region. As such, a total of three masks are used: one mask for forming the partition, another mask for cutting the spacers, and the other mask for forming pattern in the peripheral region.

Figure 1:
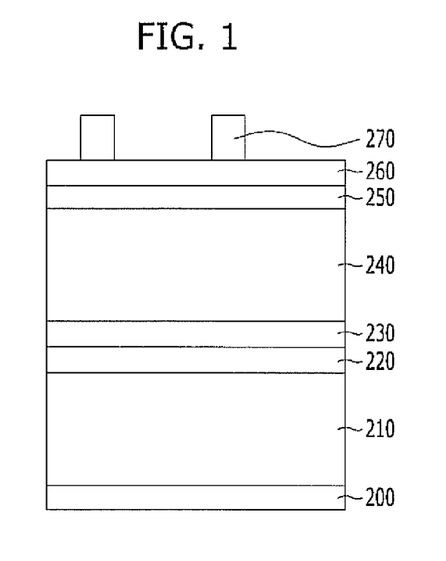
FIG. 1 is a cross-sectional view illustrating a stacked structure that is used to form fine pattern of a semiconductor device according to conventional spacer patterning technology.

When the mask for cutting the spacers and the mask for forming the pattern in the peripheral region are used separately, an etch equipment is additionally used other than mask equipment. Moreover, a hard mask has a higher etch selectivity than a pattern target layer. More specifically, the hard mask has a stacked structure to realize fine pattern of a desired line width. For example, when the fine pattern forms trenches for device isolation, the hard mask for forming the fine pattern of a desired line width has a stacked structure where a first amorphous carbon layer (ACL) 210 of approximately 1500 Å, a first silicon oxynitride (SiON) layer 220 of approximately 300 Å, a polysilicon layer 230 of approximately 400 Å, a second amorphous carbon layer (ACL) 240 of approximately 1500 Å, a second silicon oxynitride (SiON) layer 250 of approximately 300 Å, and a bottom anti-reflection coating (BARC) layer 260 are sequentially stacked over a semiconductor substrate 200. Subsequently, a partition-forming photoresist pattern 270 for forming spacers is formed as illustrated in FIG. 1.

Here, although the first amorphous carbon layer 210 and the second amorphous carbon layer 240 are each have a higher etch selectivity than the pattern target layer, they can be costly to manufacture. Therefore, when two or more amorphous layers are formed, production costs increase.

SUMMARY

An embodiment of the present invention is directed to a method that may minimize/reduce the number of masks needed when spacer patterning technology is applied to form fine pattern of a semiconductor device using the spacer patterning technology, minimize the use of an expensive hard mask layer, simplify the fabrication process, and reduce production costs.

In accordance with an embodiment of the present invention, a method for forming fine pattern of a semiconductor device includes: sequentially forming a first thin film and a second thin film over a target layer for patterning; forming a partition over the second thin film; removing the partition after forming spacers on sidewalls of the partition; forming a first pattern of the second thin film by etching the second thin film of a first region and the second thin film of a second region while exposing the spacers simultaneously; forming a second pattern of the second thin film having a finer line width than the first pattern by using the spacers as a mask and etching the first pattern of the second thin film in the first region; forming a first thin film pattern by using the first pattern and the second pattern of the second thin film as masks in the first and second regions and etching the first thin film; and etching the pattern target layer by using the first pattern and the second pattern of the second thin film as masks.

The first region may be a cell region, and the second region may be a memory peripheral circuit region.

The pattern target layer may be a semiconductor substrate, and trenches for device isolation may be formed by etching the pattern target layer.

The first thin film may include an oxide layer, and the second thin film may include a polysilicon layer.

The oxide layer may be formed to have a thickness of approximately 3500 Å or less.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2L are cross-sectional views illustrating a method for forming fine pattern of a semiconductor device in accordance with an embodiment of the present invention. In the present invention, a case where trenches for device isolation are formed as fine pattern is taken as an example and described.

Figure 2A:
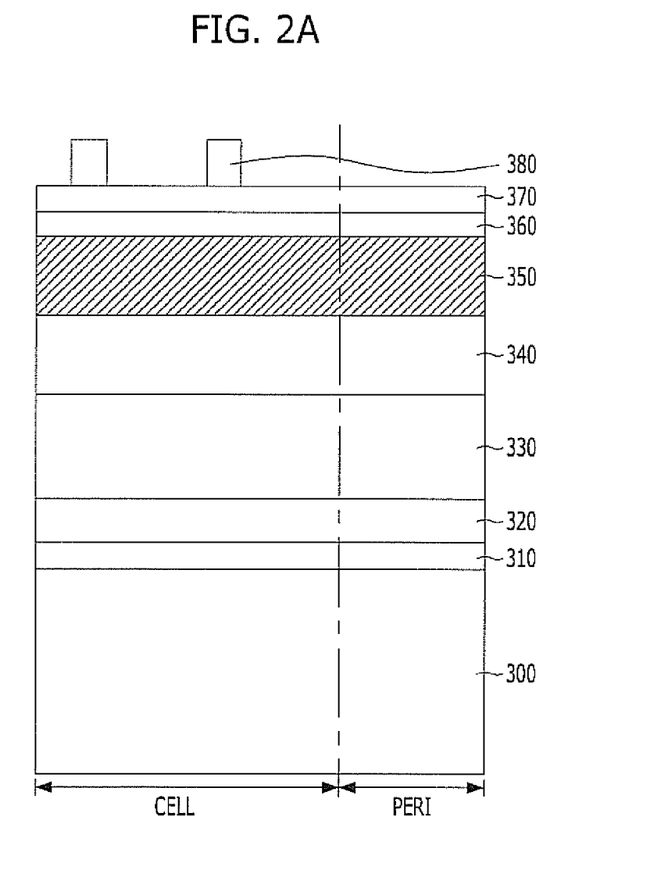
FIGS. 2A to 2L are cross-sectional views illustrating a method for forming fine pattern of a semiconductor device in accordance with an embodiment of the present invention.

Referring to FIG. 2A, a pad oxide layer 310, a pad nitride layer 320, an oxide layer 330, a polysilicon layer 340, an amorphous carbon layer (ACL) 350, a silicon oxynitride (SiON) layer 360, and a bottom anti-reflection coating (BARC) layer 370 are sequentially formed over a semiconductor substrate 300. The semiconductor substrate 300 includes a cell region CELL where fine trenches are to be formed and a peripheral region PERI where large trenches are to be formed.

Here, the thickness of the stacked layers may be set appropriately by taking into consideration the etch selectivity of an upper layer with respect to a lower layer. For example, the pad oxide layer 310 may be formed with a thickness of approximately 530 Å, and the pad nitride layer 320 may be formed with a thickness of approximately 600 Å:

Also, the oxide layer 330 may be formed with a thickness of approximately 3500 Å or less. According to an embodiment, the oxide layer 330 may be formed with a thickness ranging from approximately 1500 Å to approximately 3500 Å. The polysilicon layer 340 may be formed with a thickness of approximately 3500 Å or less. According to an embodiment, the polysilicon layer 340 may be formed with a thickness ranging from approximately 800 Å to approximately 3500 Å. The amorphous carbon layer 350 may be formed with a thickness of approximately 3500 Å or less at a temperature of approximately 350° C. to 700° C. According to an embodiment, the amorphous carbon layer 350 may be formed with a thickness ranging from approximately 1500 Å to approximately 3500 Å.

Also, the silicon oxynitride (SION) layer 360 may be formed with a thickness of approximately 200 Å or more. According to an embodiment, the silicon oxynitride (SiON) layer 360 may be formed with a thickness ranging from approximately 200 Å to approximately 300 Å. The bottom anti-reflection coating (BARC) layer 370 may be formed with a thickness of approximately 240 Å.

Subsequently, a first photoresist layer pattern 380 for forming a partition for the formation of spacers is formed by coating the upper surface of the bottom anti-reflection coating (BARC) layer 370 with a first photoresist layer and exposing and developing the first photoresist layer through any reasonably suitable, well-known exposure process (or liquid immersion lithography process) using a photoresist for krypton fluoride (KrF) or argon fluoride (ArF).

Here, the bottom anti-reflection coating (BARC) layer 370 functions as an anti-reflection layer that prevents the reflection of the surface of the substrate during the exposure process, and the silicon oxynitride (SiON) layer 360 functions as a buffer layer.

Figure 2B:
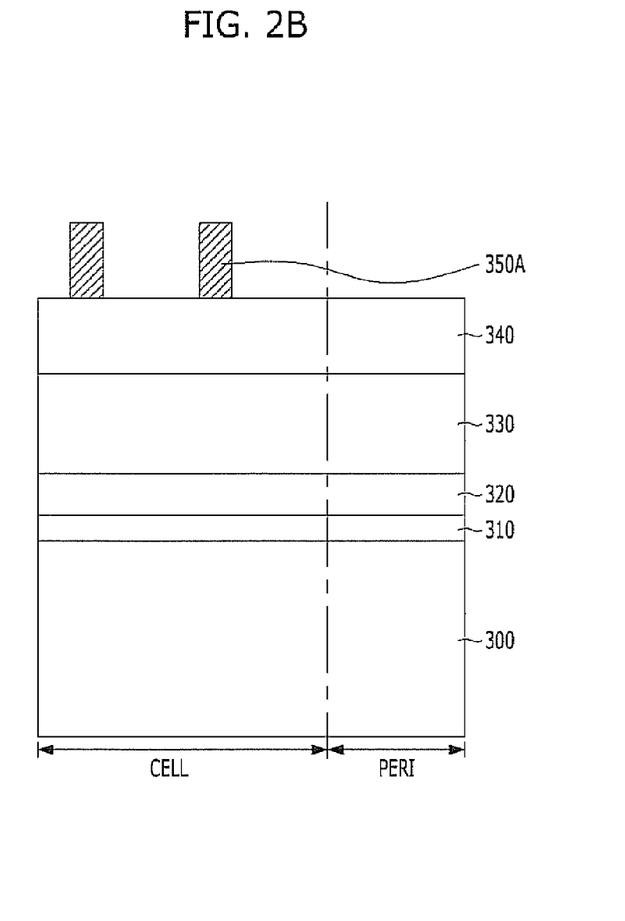

Referring to FIG. 2B, the exposed silicon oxynitride (SiON) layer 360, the bottom anti-reflection coating (BARC) layer 370, and the amorphous carbon layer 350 (FIG. 2A) are etched by using the first photoresist layer pattern 380 as a mask.

Subsequently, a partition 350A for forming spacers is formed by removing the first photoresist layer pattern 380 through a well-known photoresist stripping process, and removing the silicon oxynitride (SiON) layer 360 and the bottom anti-reflection coating (BARC) layer 370.

Figure 2C:
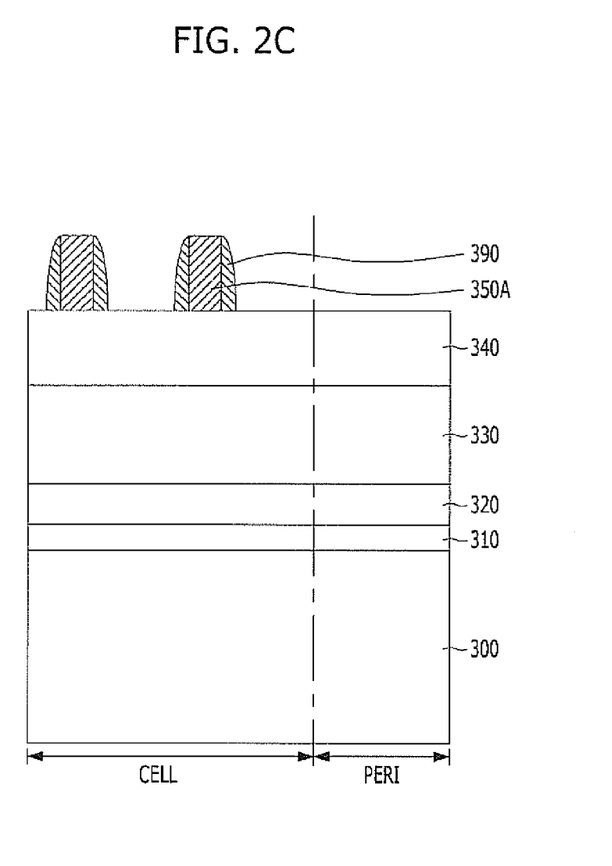

Referring to FIG. 2C, spacers 390 are formed on the sidewalls of the partition 350A by depositing a spacer-forming oxide layer over the polysilicon layer 340 including the partition 350A formed therein at a thickness of a desired line width, for example, approximately 200 Å, and at a temperature of approximately 50° C., and etching the spacer-forming oxide layer to expose the upper surface of the partition 350A and the surface of the polysilicon layer 340.

Figure 2D:
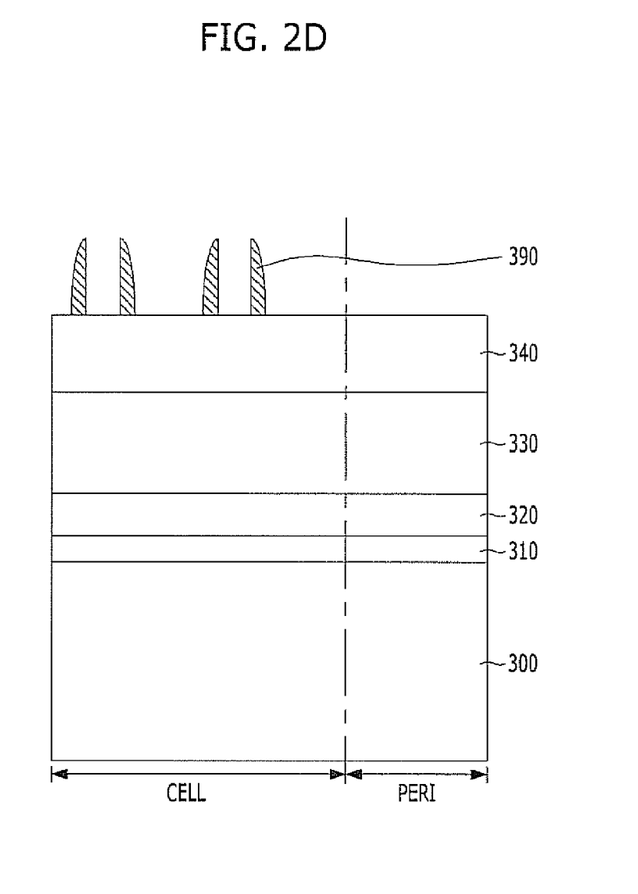

Referring to FIG. 2D, the partition 350A is removed to completely expose the spacers 390. Here, when the spacers 390 are formed of an oxide layer, film lifting may be easier as compared with a case where the spacers 390 are formed of a nitride layer.

Figure 2E:
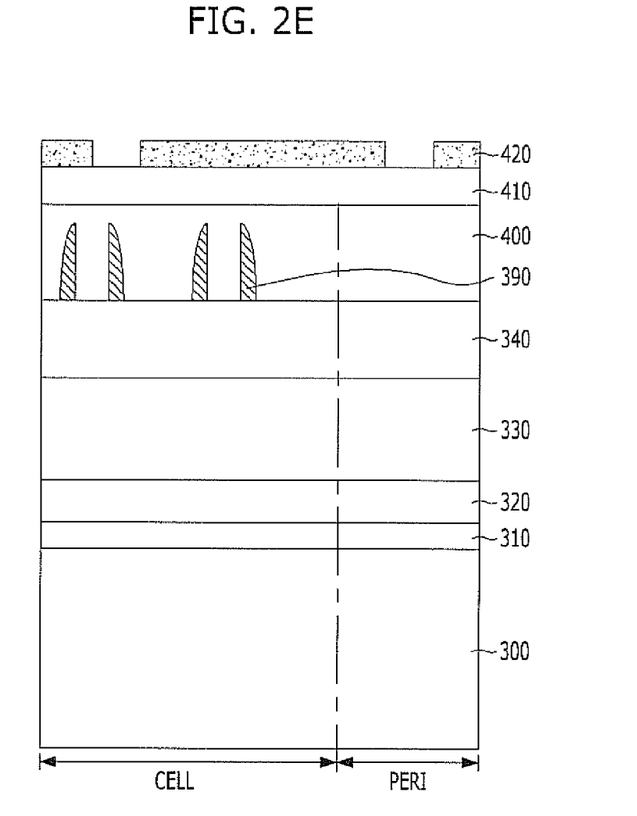

Referring to FIG. 2E, a spin-on carbon (SOC) layer 400 and a multi-function hard mask (MFHM) layer 410 are sequentially formed over the polysilicon layer 340 to cover the spacers 390 and the polysilicon layer 340.

Subsequently, a second photoresist layer pattern 420 is formed by forming a second photoresist layer, exposing the second photoresist layer through any reasonably suitable, well-known exposure process (or liquid immersion lithography process) using a photoresist for krypton fluoride (KrF) or argon fluoride (ArF).

Here, the second photoresist layer pattern 420 includes an opening that exposes a portion of the multi-function hard mask (MFHM) layer 410. The opening of the second photoresist layer pattern 420 includes a first opening 450A that exposes a portion of the multi-function hard mask (MFHM) layer 410 in the peripheral circuit region PERT and a second opening 450B that exposes a spacer cutting region of the cell region CELL.

As described above, since the mask for the spacer cutting region of the cell region CELL and the mask for the peripheral circuit region PERT are not separately formed but formed together as the second photoresist layer pattern 420, the number of mask processes may be decreased. Also, although a silicon oxynitride layer is not additionally formed under the spacers 390, the polysilicon layer 340 may sufficiently serve the function of a buffer layer. Moreover, since a stacked layer of the spin-on carbon (SOC) layer 400 and the multi-function hard mask (MFHM) layer 410 is used as a hard mask instead of a more expensive amorphous carbon layer, production costs may be reduced.

Figure 2F:
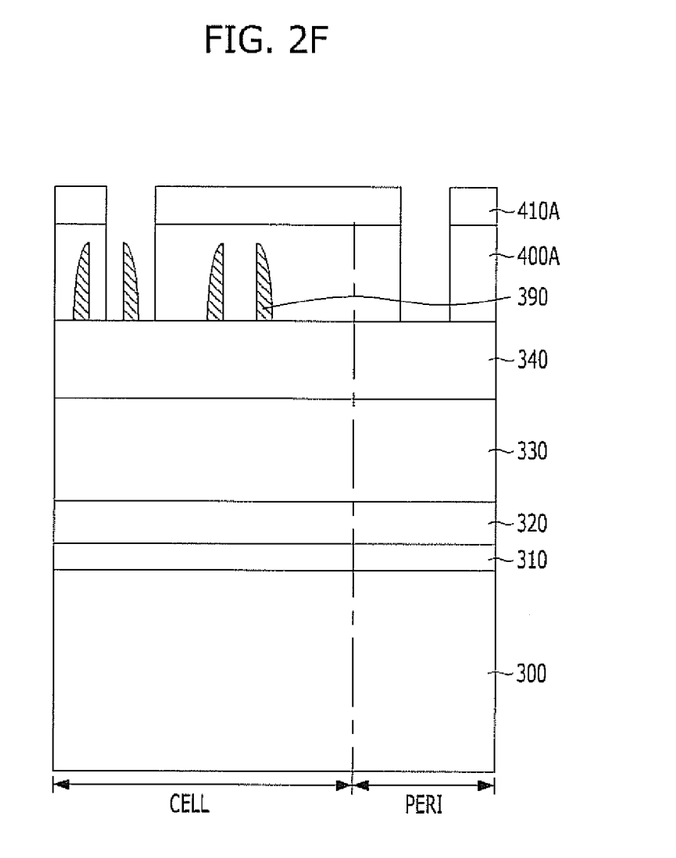

Referring to FIG. 2F, the exposed multi-function hard mask (MFHM) layer 410 and the spin-on carbon (SOC) layer 400 are etched using the second photoresist layer pattern 420 as a mask so as to expose a portion of the polysilicon layer 340 in the peripheral circuit region PERI and the spacer cutting region of the cell region CELL. Hereinafter, the etched multi-function hard mask (MFHM) layer 410 is referred to as a multi-function hard mask (MFHM) layer pattern 410A, and the etched spin-on carbon (SOC) layer 400 is referred to as a spin-on carbon (SOC) layer pattern 400A.

Subsequently, the second photoresist layer pattern 420 is removed through any reasonably suitable, well-known photoresist stripping process.

Figure 2G:
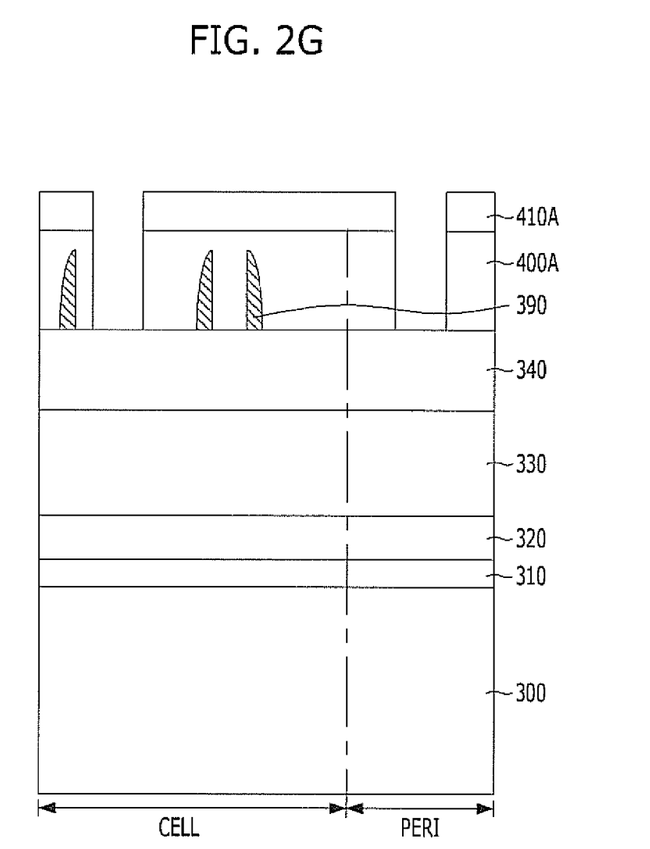

Referring to FIG. 2G, the spacers 390 are cut by using the multi-function hard mask (MFHM) layer pattern 410A and the spin-on carbon (SOC) layer pattern 400A as masks and removing the spacer cutting region that is exposed through the spacer cutting etch process.

Here, the spacers 390 are cut to isolate the spacers 390 because when the spacers 390 are formed on the sidewalls of the partition 350A, the spacers 390 are formed with the shape of rim enclosing the partition 350A.

Figure 2H:
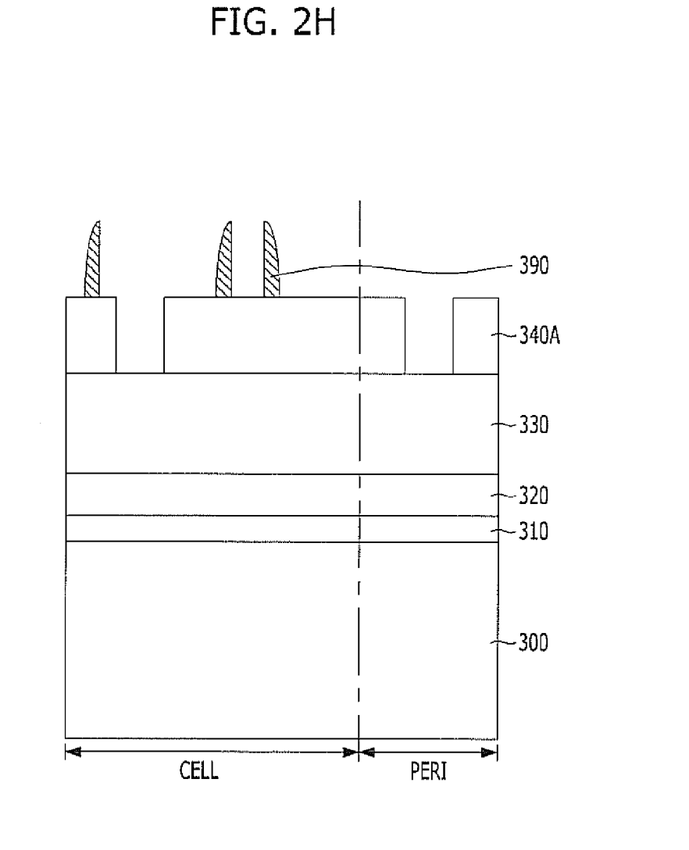

Referring to FIG. 2H, a first polysilicon layer pattern 340A is formed by using the multi-function hard mask (MFHM) layer pattern 410A and the spin-on carbon (SOC) layer pattern 400A as masks and etching the exposed portion of the polysilicon layer 340 of the cell region CELL and the peripheral circuit region PERI.

Here, the cutting of the spacers 390 and the formation of the first polysilicon layer pattern 340A may be performed consecutively using the same etch equipment.

Subsequently, the multi-function hard mask (MFHM) layer pattern 410A and the spin-on carbon (SOC) layer pattern 400A are removed.

Figure 2I:
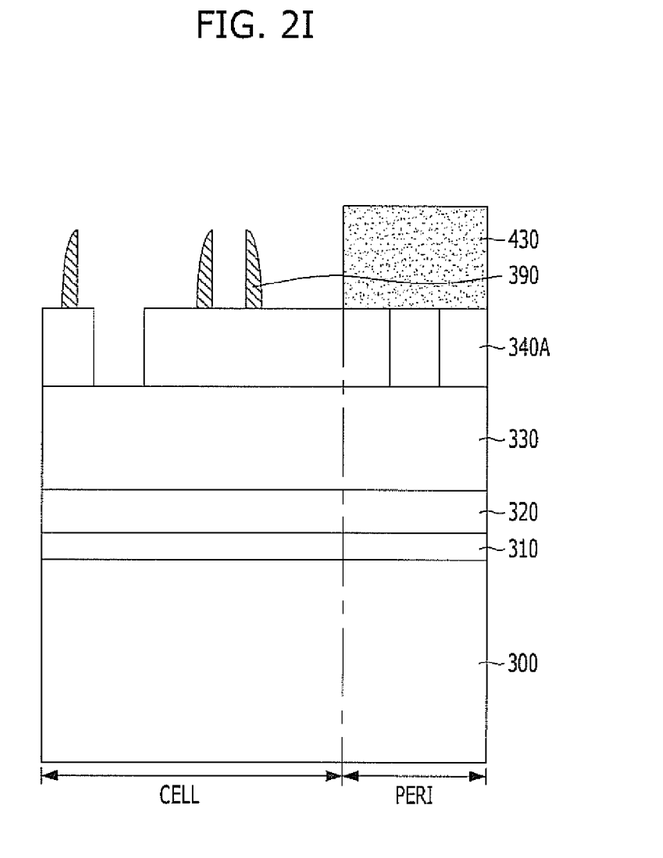

Referring to FIG. 2I, a third photoresist layer pattern 430 that opens the cell region CELL and masks the peripheral circuit region PERI is formed. Here, the third photoresist layer pattern 430 may be formed through an exposure process using a photoresist for krypton fluoride (KrF) (e.g., using a photoresist of krypton fluoride or using a krypton fluoride laser) because the third photoresist layer pattern 430 does not have to be formed as fine pattern. Therefore, production costs may be saved as compared with a case where the third photoresist layer pattern 430 is formed through a liquid immersion lithography process or using an exposure mask for ArF.

Figure 2J:
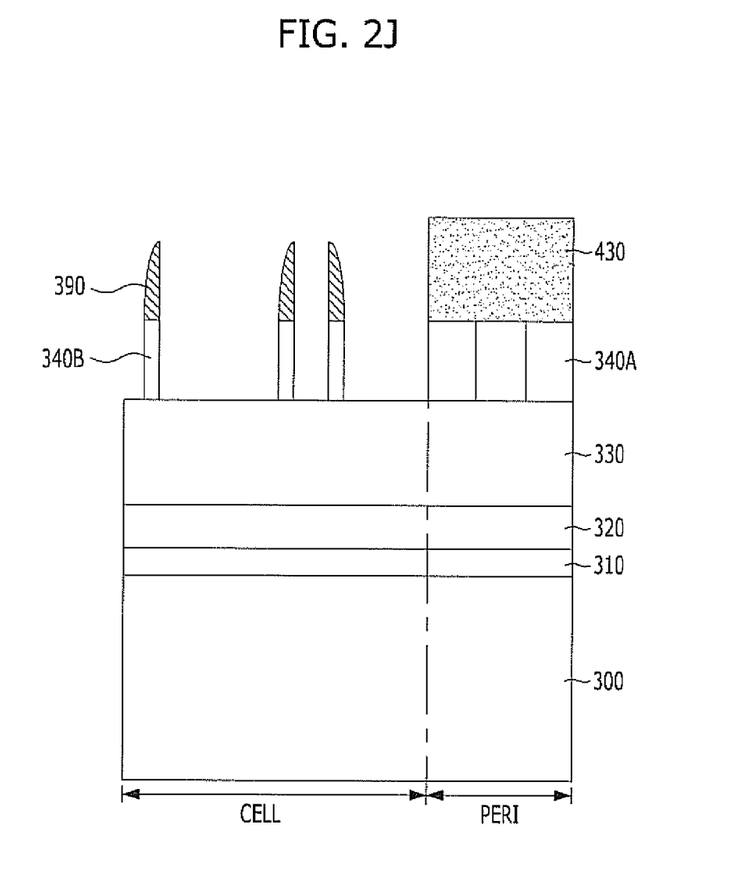

Referring to FIG. 2J, a second polysilicon layer pattern 340B having a finer line width than the line width of the first polysilicon layer pattern 340A is formed in the cell region CELL that is open by the third photoresist layer pattern 430 by using the spacers 390 as an etch mask and etching the first polysilicon layer pattern 340A, which is disposed under the spacers 390.

Figure 2K:
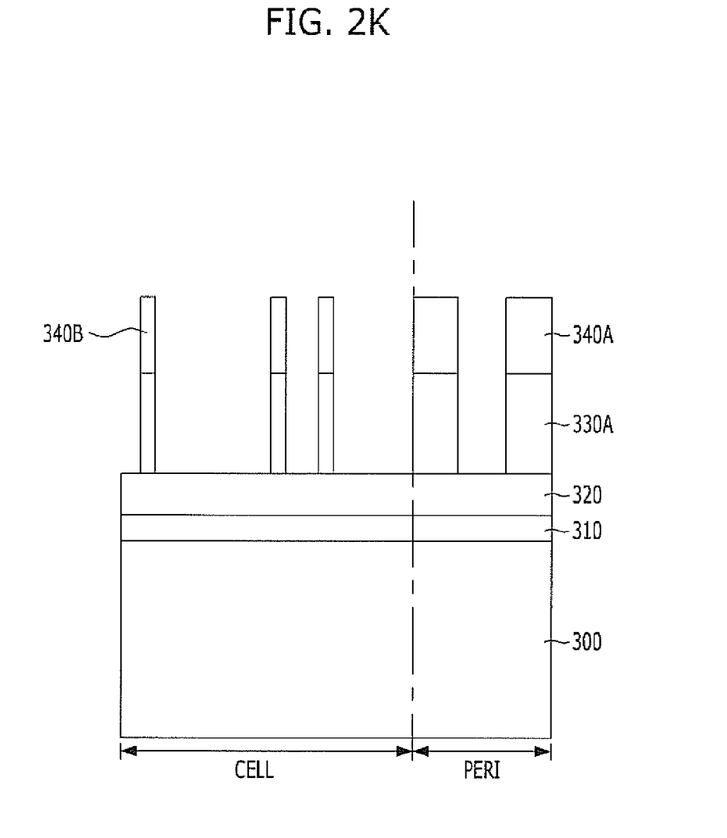

Referring to FIG. 2K, an oxide layer pattern 330A is formed in the cell region CELL and the peripheral circuit region PERT by removing the third photoresist layer pattern 430 through any reasonably suitable, well-known photoresist stripping process and using the first polysilicon layer pattern 340A of the peripheral circuit region PERI and the second polysilicon layer pattern 340B of the cell region CELL as masks and etching the oxide layer 330 disposed therebelow until the pad nitride layer 320 is exposed.

Figure 2L:
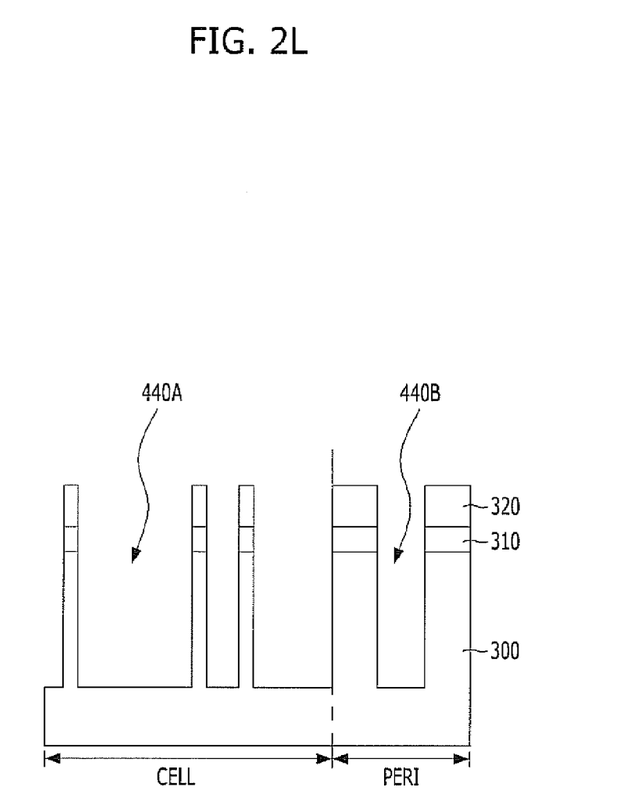

Referring to FIG. 2L, first trenches 440A of a fine line width are formed in the cell region CELL and second trenches 440B having a thicker line width than the first trenches 440A are formed in the peripheral circuit region PERI by using the first polysilicon layer pattern 340A, the second polysilicon layer pattern 340B, and the oxide layer pattern 330A as masks and etching the pad nitride layer 320, the pad oxide layer 310, and the semiconductor substrate 300.

Subsequently, the first polysilicon layer pattern 340A, the second polysilicon layer pattern 340B, and the oxide layer pattern 330A are removed. Afterward, although not illustrated in the drawing, a subsequent process, such as a process of forming an isolation layer, is performed.

As described above, according to the embodiment of the present invention, since the mask for the spacer cutting region in the cell region and the mask for the peripheral circuit region are not separately formed and formed as one mask pattern, the number of mask processes may be reduced. Also, although a silicon oxynitride layer is not additionally formed under the spacers, the polysilicon layer alone may sufficiently serve as a buffer layer. Moreover, since the stacked layer of the spin-on carbon layer and the multi-function hard mask layer are used as a hard mask layer, instead of an expensive amorphous carbon layer, production costs may be reduced.

While the present invention has been described with respect to the specific embodiments, it will be apparent to those skilled in the art that various changes and modifications may be made without departing from the spirit and scope of the invention as defined in the following claims.

For example, although a case where the fine pattern of a semiconductor device forms trenches for device isolation is taken as an example and described, the fine pattern may form any other reasonably suitable structures including but not limited to gates.

Also, the present embodiment illustrates a memory device including memory cells and peripheral circuits, but the exemplary embodiments of the present invention may be applied not only to the memory device but also to general semiconductor devices that include both fine trenches and larger trenches than the fine trenches at the same time.

What is claimed is:

1. A method for forming a fine pattern of a semiconductor device, comprising:
   sequentially forming a first thin film and a second thin film over a target layer for patterning;
   forming a partition over the second thin film;
   removing the partition after forming spacers on sidewalls of the partition;
   forming a first pattern of the second thin film by etching the second thin film of a first region and the second thin film of a second region while exposing the spacers simultaneously;
   forming a second pattern of the second thin film having a finer line width than the first pattern by using the spacers as a mask and etching the first pattern of the second thin film in the first region;
   forming a first thin film pattern by using the first pattern and the second pattern of the second thin film as masks in the first and second regions and etching the first thin film; and
   etching the pattern target layer by using the first pattern and the second pattern of the second thin film as masks.

2. The method of claim 1, wherein the first region is a cell region and the second region is a memory peripheral circuit region.

3. The method of claim 1, wherein the pattern target layer is a semiconductor substrate and trenches for device isolation are formed by etching the pattern target layer.

4. The method of claim 1, wherein the first thin film comprises an oxide layer and the second thin film comprises a polysilicon layer.

5. The method of claim 4, wherein the oxide layer is formed to have a thickness of approximately 3500 Å or less.

6. The method of claim 4, wherein the polysilicon layer is formed to have a thickness of approximately 3500 Å or less.

7. The method of claim 1, wherein the partition is formed of an amorphous carbon layer.

8. The method of claim 7, wherein the amorphous carbon layer is formed to have a thickness of approximately 3500 Å or less at a temperature of approximately 350° C. to approximately 700° C.

9. The method of claim 1, wherein the spacers are formed of an oxide layer.

10. The method of claim 9, wherein the oxide layer is formed to have a thickness of approximately 200 Å or more at a temperature of approximately 50° C. or higher.

11. The method of claim 1, wherein the exposing of the spacers and the forming of the first pattern of the second thin film are performed using a stacked layer of a spin-on carbon layer as a mask.

12. The method of claim 1, wherein in the forming of the second pattern of the second thin film,
 the second region is masked by a photoresist layer pattern and the second pattern is formed in the first region.

13. The method of claim 12, wherein the photoresist layer pattern is formed through an exposure process using a photoresist of krypton fluoride (KrF).

14. The method of claim 1, wherein the forming of the first thin film pattern includes forming the first thin film pattern in the first and second regions simultaneously by using the first pattern and the second pattern of the second thin film as the masks in the first and second regions and etching the first thin film.

\* \* \* \* \*